United States Patent
Meng et al.

(10) Patent No.: US 8,748,221 B2
(45) Date of Patent: Jun. 10, 2014

(54) NANOBALL SOLUTION COATING METHOD AND APPLICATIONS THEREOF

(71) Applicant: National Chiao Tung University, Hsinchu (TW)

(72) Inventors: Hsin-Fei Meng, Hsinchu (TW); Hsiao-Wen Zan, Jhudong Township, Hsinchu County (TW); Yen-Chu Chao, Taipei (TW); Kai-Ruei Wang, Jhubei (TW); Yung-Hsuan Hsu, Taitung (TW)

(73) Assignee: National Chiao Tung University, Hsinchu (TW)

( * ) Notice: Subject to any disclaimer, the term of this patent is extended or adjusted under 35 U.S.C. 154(b) by 86 days.

(21) Appl. No.: 13/665,215

(22) Filed: Oct. 31, 2012

(65) Prior Publication Data
US 2014/0045297 A1    Feb. 13, 2014

(30) Foreign Application Priority Data
Aug. 7, 2012  (TW) .............. 101128412 A

(51) Int. Cl.
  H01L 21/02    (2006.01)
  H01L 21/033   (2006.01)
  H01L 51/00    (2006.01)
  B01D 67/00    (2006.01)

(52) U.S. Cl.
  CPC ........ H01L 21/0337 (2013.01); H01L 51/0002 (2013.01); B01D 67/0058 (2013.01); B01D 67/006 (2013.01); Y10S 977/781 (2013.01); Y10S 977/778 (2013.01); Y10S 977/893 (2013.01)
  USPC .............. 438/99; 438/82; 438/637; 438/640; 977/781; 977/778; 977/893; 257/E21.004; 427/428.01

(58) Field of Classification Search
  CPC . H01L 21/0337; H01L 51/00; H01L 51/0002; H01L 2251/5369; B01D 67/0034; B01D 67/0058; B01D 67/006; B01D 67/0062
  USPC .............. 438/99, 82, 637–640; 977/781, 778, 977/893; 257/E51.004; 427/428.01
  See application file for complete search history.

(56) References Cited

U.S. PATENT DOCUMENTS 7,732,005 B2 * 6/2010 Tsuchiya et al. .............. 427/130
7,901,776 B2 * 3/2011 Paolucci et al. ............... 428/408
(Continued)

FOREIGN PATENT DOCUMENTS

TW    201021222    6/2010

OTHER PUBLICATIONS

Fujimoto, et al., "High-Performance, Vertical-Type Organic Transistors with Built-In Nanotriode Arrays", Advanced Materials, 2007, vol. 19, pp. 525-530.

(Continued)

Primary Examiner — Michael Trinh
(74) Attorney, Agent, or Firm — Muncy, Geissler, Olds & Lowe, P.C.

(57) ABSTRACT

The present invention discloses a nanoball solution coating method and applications thereof. The method comprises steps: using a scraper to coat a nanoball solution on a substrate to attach a plurality of nanoballs on the substrate; flushing or flowing through the substrate with a heated volatile solution to suspend the nanoballs unattached to the substrate in the volatile solution; and using the scraper to scrape off the volatile solution carrying the suspended nanoballs, whereby is simplified the process to coat nanoballs. The method can be used to fabricate nanoporous films, organic vertical transistors, and large-area elements and favors mass production.

20 Claims, 6 Drawing Sheets

(56) References Cited

U.S. PATENT DOCUMENTS

| | | | |
|---|---|---|---|
| 2005/0224779 A1* | 10/2005 | Wang et al. | 257/9 |
| 2011/0048947 A1 | 3/2011 | Petronis et al. | |
| 2011/0135881 A1* | 6/2011 | Burkhardt | 428/172 |
| 2011/0244116 A1* | 10/2011 | Badre et al. | 427/58 |
| 2012/0086431 A1* | 4/2012 | Zan et al. | 324/76.11 |
| 2012/0104440 A1* | 5/2012 | Peng et al. | 257/98 |

OTHER PUBLICATIONS

Fujimoto, et al., "Organic Static Induction Transistors with Nano-Hole Arrays Fabricated by Colloidal Lithography", e-Journal of Surface Science and Nanotechnology, Nov. 22, 2005, vol. 3, pp. 327-331.

Chao, et al., "Polymer space-charge-limited transistor", American Institute of Physics, Applied Physics letters, 2006, vol. 88, pp. 223301-1-223301-3.

Chen, et al., "Light-emitting polymer space-charge-limited transistors", American Institute of Physics, Applied Physics Letters, 2008, vol. 93, pp. 223301-1-223301-3.

Wu, et al., "High-performance space-charge-limited transistors with well-ordered nanoporous aluminum base electrode", American Institute of Physics, Applied Physics Letters, 2011, vol. 99, pp. 093306-1-093306-3.

Ho, et al., "Fabrication of Monolayer of Polymer/Nanospheres Hybrid at a Water-Air Interface", ACS Applied Materials and Interfaces, Jan. 10, 2011, pp. 204-208.

Chao, et al., "Large-area non-close-packaged nanosphere deposition by blade coating for vertical space-charge-limited transistor" Orgele, Oct. 10, 2012, Article No. 1825, Model 3G, pp. 1-7.

* cited by examiner

NANOBALL SOLUTION COATING METHOD AND APPLICATIONS THEREOF

BACKGROUND OF THE INVENTION

1. Field of the Invention

The present invention relates to a nanoball solution coating method and applications thereof, particularly to a nanoball solution coating method easy to operate and able to mass produce, and applications thereof.

2. Description of the Related Art

Kiyoshi Fujimoto, et al. proposed a paper "Organic Static Induction Transistors with Nano-Hole Arrays Fabricated by Colloidal Lithography" in 2005, and a paper "High-Performance, Vertical-Type Organic Transistors with Built-In Nanotriode Arrays" in 2007. In the two papers, a glass substrate is immersed in pure water and acetone, processed with an ultrasonic oscillator, dried, and then exposed to ultraviolet light/ozone for 20 minutes. Next, polystyrene nanoballs are electrostatically attached to the glass substrate, wherein the substrate is immersed in 0.01 wt % nanoball solution for 30 minutes to make nanoballs attach to the substrate saturatedly. Next, the substrate is immersed in ultrapure water heated to a temperature of 98° C. to flush away the residual nanoballs with the thermal current of hot water. Next, the substrate is flushed with cool water and dried. Thus is completed a process to attach nanoballs on a substrate. For the method, the uniformity of the nanoballs attached to the substrate is considerably influenced by the uniformity of the nanoball solution. Further, the process of the method is time-consuming and unfavorable for mass production.

Yu-Chiang Chao et al. proposed a paper "Polymer Space-Charge-Limited Transistor" in 2006, and a paper "Light-Emitting Polymer Space-Charge-Limited Transistor" in 2008. In the two papers, a substrate is immersed in a 0.4 wt % nanoball solution for tens of seconds; next, the substrate is immersed in heated isopropanol for 10 seconds to flush away the residual nanoballs with the thermal current of the heated isopropanol, whereby a single layer of nanoballs remains on the substrate. Then, the isopropanol on the substrate is rapidly dried with a nitrogen blower. The method is applicable to fabricate small-area elements but less likely to produce large-area elements. Besides, the products thereof lack stability.

Kun-Yang Wu et al. proposed a paper "High-Performance Space-Charge-Limited Transistor with Well-Ordered Nanoporous Aluminum Base Electrode" in 2011. Chi-Chih Ho proposed a paper "Fabrication of Monolayer of Polymer/Nanospheres Hybrid at a Water-Air Interface" in 2011. In the two papers, polystyrene nanoballs are suspended in water, and 1-3 ppm polystyrene oxide is added to the water to enhance coalescence of the nanoballs. Next, the nanoballs are deposited on a substrate. Next, oxygen plasma is used to shrink the nanoballs, whereby is obtained ordered nanopores. However, the process of the method is complicated and time-consuming and thus unfavorable to industrial application.

A Taiwan patent No. 097146142 disclosed a technology, which uses a spin-coating method to deposit nanoballs on a glass substrate, and uses oxygen plasma to control the size of the nanoballs. However, the spin-coating machine used by this method wastes a lot of nanoball material and impedes mass production.

A US patent of publication No. US2011/0048947 disclosed an electrostatic nanoball attaching method. In this method, the substrate is positively charged and immersed in a solution of negatively charged PS nanoballs for 2 minutes, wherein the solution is an aqueous solution having a sulfate and 1% PS nanoballs with a diameter of 100 nm. Next, the substrate is flushed with water for 1 minute. Next, the substrate is dried with a spin method or a nitrogen blower. The nanoballs are likely to be displaced or separated by surface tension of water during drying. Therefore, a low-surface tension solution is usually used to replace water. Besides, the method has too many steps and is unfavorable to mass production.

Accordingly, the present invention proposes a nanoball solution coating method and applications thereof to overcome the abovementioned problems.

SUMMARY OF THE INVENTION

The primary, objective of the present invention is to provide a nanoball solution coating method and applications thereof, wherein a scraper is used to coat nanoballs and a heated volatile solution is used to flush the coat nanoballs for rearranging the nanoballs, whereby is greatly simplified the process and effectively enhanced the mass productivity, and whereby the nanoballs can be coat on a large-area semiconductor element in a higher density.

To achieve the abovementioned objective, the present invention proposes a nanoball solution coating method, which is used to attach nanoballs of a nanoball solution to the surface of a substrate, and which comprises steps: dripping a nanoball solution on the surface of a substrate and using a scraper to coat the nanoball solution on the surface of the substrate so as to attach a plurality of nanoballs on the surface of the substrate; flushing or flowing through the surface of the substrate with a heated volatile solution to suspend the unattached nanoballs in the volatile solution; and using the scraper to scrape off the volatile solution carrying the unattached nanoballs from the surface of the substrate.

The present invention also proposes a method for fabricating a nanoporous film, which comprises steps: a. providing a substrate and dripping a row of a nanoball solution on the substrate; b. using a scraper to coat the nanoball solution on the substrate so as to attach a plurality of nanoballs on the substrate; c. forming a film covering the substrate and the nanoballs; d. sticking an adhesive material onto the film; e. peeling off the adhesive material to physically remove the nanoballs covered by the film to form a nanoporous film.

The present invention also proposes a method using the abovementioned methods to fabricate an organic vertical transistor, which comprises steps: providing a substrate having a transparent conductive layer; forming an emitter layer or a collector layer on the transparent conductive layer; coating an insulating layer on the emitter layer or collector layer; coating a nanoball solution on the insulating layer so as to attach a plurality of nanoballs on the insulating layer; forming a base layer covering the substrate and the nanoballs; covering the base layer with an adhesive material; peeling off the adhesive material to physically remove the nanoballs covered by the base layer so as to form a porous base layer; using the porous base layer as a mask to etch the insulating layer to form a plurality of holes revealing the emitter layer or collector layer; forming an active layer covering the emitter or collector layer and the pores; and forming a collector layer or an emitter layer on the active layer.

Below, embodiments are described in detail to make easily understood the objectives, technical contents, characteristics and efficacies of the present invention.

DETAILED DESCRIPTION OF THE INVENTION

Figure 1:
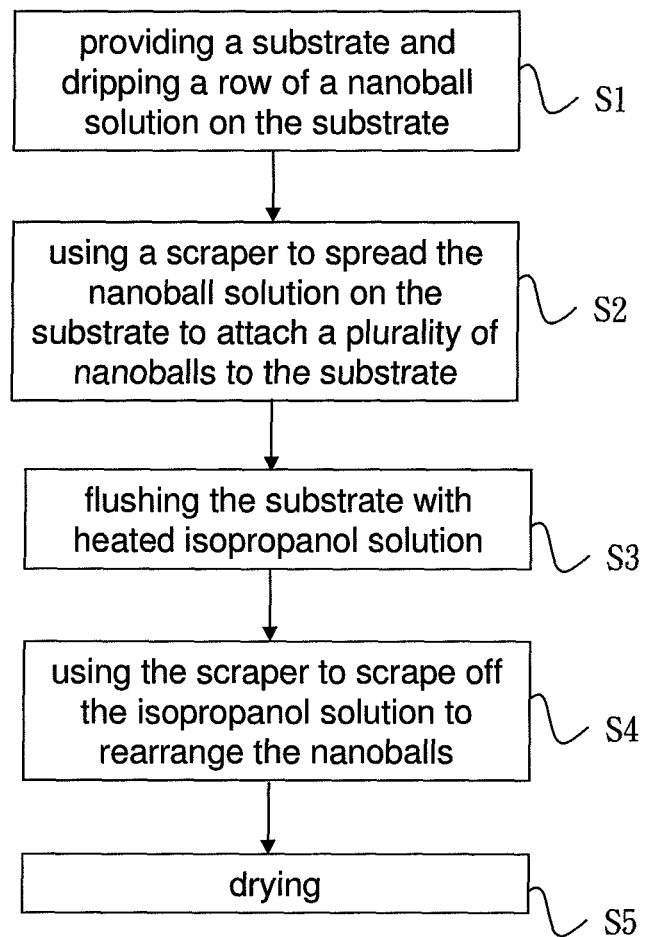
FIG. 1 is a flowchart of a nanoball solution coating method according to one embodiment of the present invention.
Figure 2:
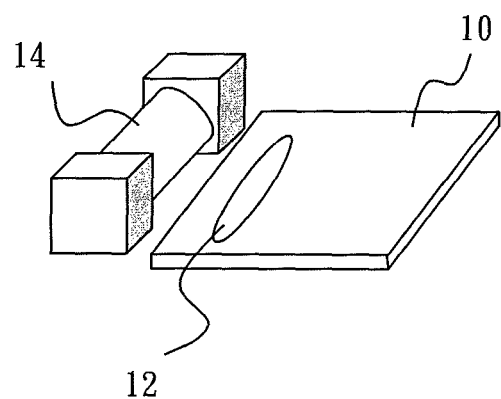
FIG. 2 schematically shows a machine table for a nanoball solution coating method according to one embodiment of the present invention.
Figure 3:
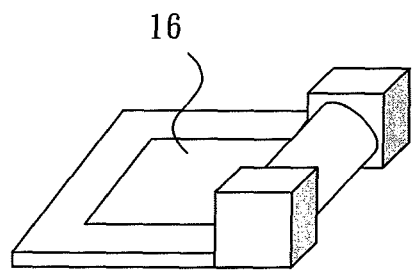
FIG. 3 schematically shows that the machine table shown in FIG. 2 is used to coat a nanoball solution according to one embodiment of the present invention.

The present invention is mainly a method for depositing nanoballs on a substrate and attaching the nanoballs to the substrate. Refer to FIG. 1 a flowchart of a nanoball solution coating method according to one embodiment of the present invention. In Step S1, provide a substrate 10, and drip a row of a nanoball solution 12 on the substrate 10. Refer to FIG. 2. In Step S2, use a scraper 14 to coat the nanoball solution 12 on the substrate 10 so as to attach a plurality of nanoballs, which are designated by 16 in FIG. 3, to the substrate 10. In Step S3, flush the substrate 10 with a heated volatile solution, which is miscible with the nanoball solution, such as water or an alcohol that is liquid at ambient temperature. In this embodiment, the volatile solution is exemplified by an isopropanol solution. Thereby, the nanoballs unattached to the substrate are suspended in the isopropanol solution. In Step S4, use the scraper to scrape off the isopropanol carrying the unattached nanoballs from the substrate to make the nanoballs rearrange on the substrate. In Step S5, dry the isopropanol solution on the substrate via blowing the substrate with cool air, heating the substrate or another method. Thus, a layer of nanoballs uniformly distributed in a high density is attached to the surface of the substrate.

In order to uniformly distribute the nanoballs, Step S3 and Step S4 may be repeatedly undertaken before Step 5.

In the present invention, the nanoballs are uniformly distributed on the substrate in a high density via using a scraper to coat the nanoball solution, which simplifies the nanoball coating process, and which applies to fabricating large-area elements and favors mass production. The gap between the scraper and the substrate is within 2-300 m. The scraper has a circular, rectangular, polygonal or blade shape.

Figure 4:
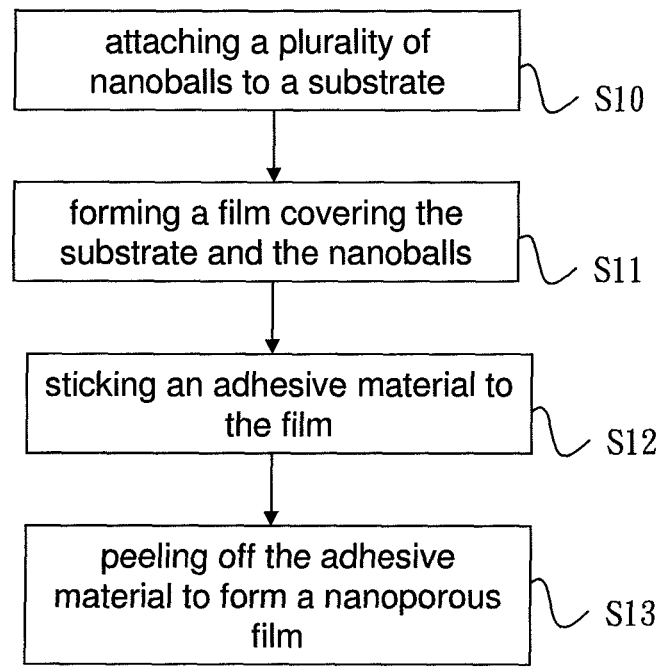
FIG. 4 is a flowchart of using a scraper-coating method to fabricate a nanoporous film according to one embodiment of the present invention.

Refer to FIG. 4. The present invention further uses the abovementioned scraper-coating method to fabricate a nanoporous film. In Step S10, coat a plurality of nanoballs on a substrate, using the abovementioned Steps S1-S5, wherein the gap between the scraper and the substrate is between 2 to 300 μm, and wherein the scraper has a circular, rectangular, polygonal or blade shape.

Figure 5:
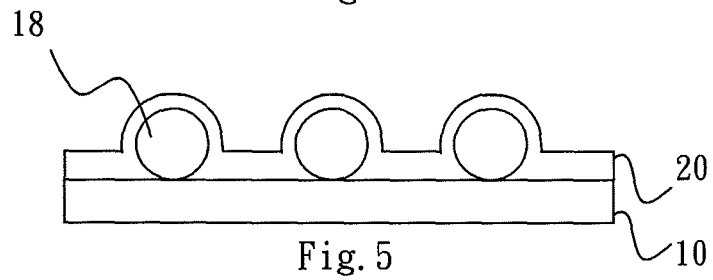
FIGS. 5-13 are sectional views schematically showing the steps of using a scraper-coating method to fabricate an organic vertical transistor according to one embodiment of the present invention.
Figure 6:
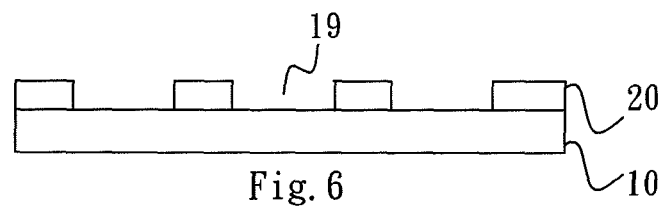
Figure 7:
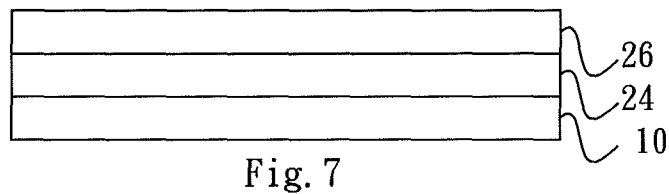
Figure 8:
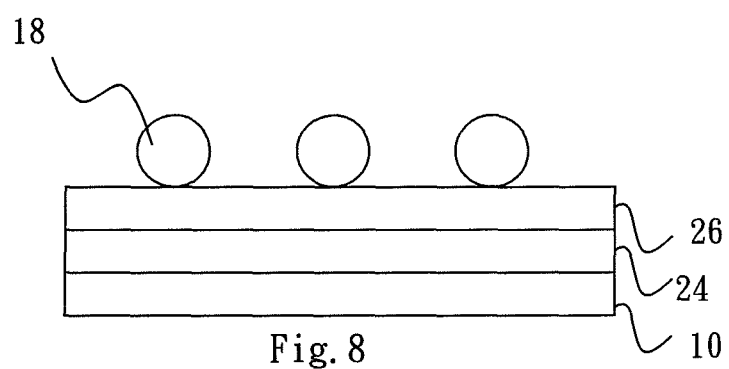

Refer to FIG. 5. In Step S11, form a film 20 covering the substrate 10 and the nanoballs 18. Next, in Step S12, stick an adhesive material, such as an adhesive tape, onto the film 20. Next, in Step S13, peel off the adhesive material to physically remove the nanoballs 18 covered by the film 20. Thus is formed a film 20 having nanopores 19 on the substrate 10, as shown in FIG. 6. In addition to the physical method, the nanoballs 18 can be removed with a solvent method, wherein a solvent is used to dissolve the nanoballs 18, whereafter the nanoballs 18 and the film 20 covering the nanoballs 18 are removed together, whereby the remaining film 20 has nanopores 19.

Furthermore, the present invention uses the abovementioned scraper-coating method to fabricate an organic vertical transistor.

Refer to FIGS. 7-13. Firstly, provide a substrate 10 having a transparent conductive layer (not shown in the drawings) on the surface thereof, and form an emitter layer 24 on the transparent conductive layer. In this embodiment, it is the emitter layer 24 that is formed on the transparent conductive layer. However, a collector layer may be formed on the transparent conductive layer in other embodiments. Next, coat an insulating layer 26 on the emitter layer 24. In one embodiment, the insulating layer 26 is made of PVP (polyvinyl pyrrolidone) and has a thickness of 200 nm. The insulating layer 26 is annealed at a temperature of 200° C. for 1 hour. Thus is formed the structure shown in FIG. 7. Next, use the abovementioned Steps S1-S5 to coat nanoballs 18 on the insulating layer 26 and form the structure shown in FIG. 8.

Figure 9:
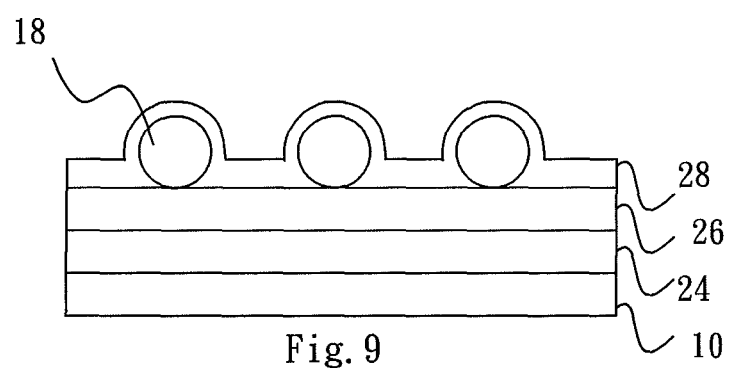
Figure 10:
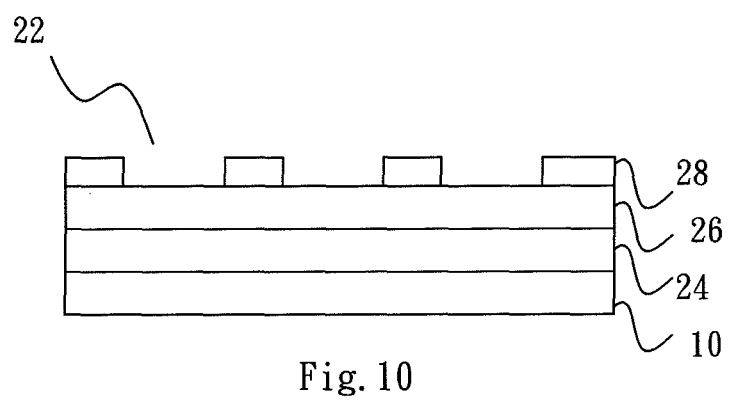
Figure 11:
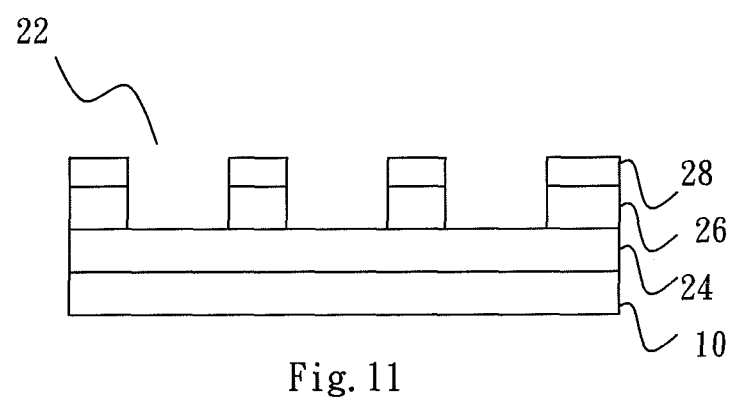
Figure 12:
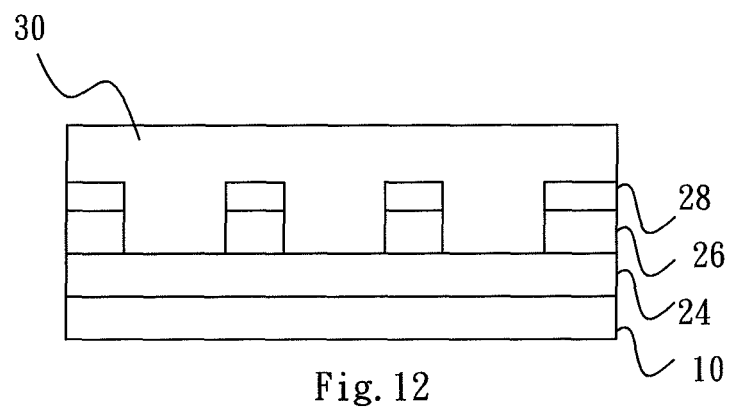
Figure 13:
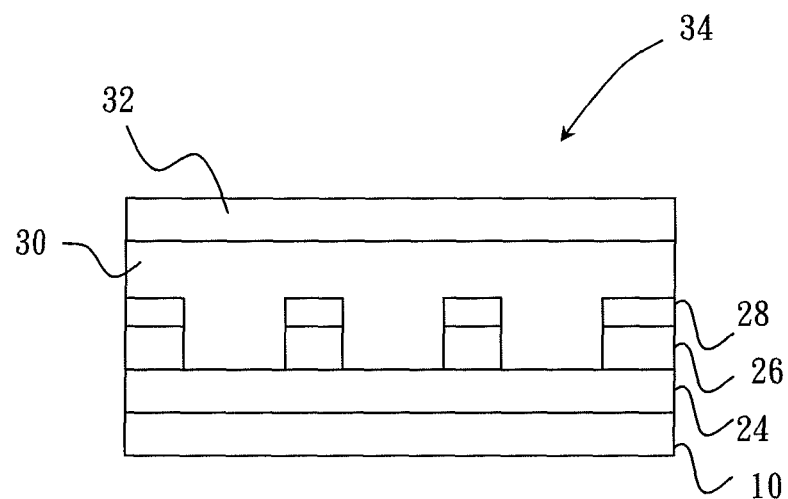

Next, form a base layer 28 covering the insulating layer 26 and the nanoballs 18, as shown in FIG. 9. In one embodiment, the base layer 28 is made of aluminum. Next, stick an adhesive material, such as an adhesive tape, onto the base layer 28. Next, peel off the adhesive material to physically remove the nanoballs 18 covered by base layer 28 to form a base layer 28 having nanopores 22, as shown in FIG. 10. Next, use oxygen plasma to etch the insulating layer 26 with the pore-containing base layer 28 being a mask, to form a plurality of holes revealing the emitter layer 24, as shown in FIG. 11.

Next, use a spin-coating method or a scraper-coating method to form an active layer 30 filled into the nanopores 22 and covering the base layer 28. The active layer 30 is annealed at a temperature of 200° C. for 10 minutes. Thus is formed a structure shown in FIG. 12. In one embodiment, the active layer 20 is made of P3HT (poly-3-hexyl thiophene). Next, electroplate on the active layer 30 an $MoO_3$ (molybdenum oxide) layer and an aluminum layer jointly functioning as a collector layer 32 (or an emitter layer). Thus is completed a vertical transistor element 34 shown in FIG. 13.

In one embodiment, before the nanoballs 18 are coat on the insulating layer 26, a P3HT layer is coated on the insulating layer 26 to increase the attachability of the nanoballs 18 to the insulating layer 26. Next, the residual P3HT is flushed away with xylene. Then, a scraper is used to coat the nanoballs 18 on the P3HT layer.

In conclusion, the present invention proposes a novel nanoball solution coating method and applications thereof, which use a scraper to coat a nanoball solution to distribute nanoballs on a substrate uniformly in a high density, and which use heated isopropanol to flush the substrate to rearrange the nanoballs, whereby is greatly simplified the process to coat nanoballs and favored the mass production of organic vertical transistors. The scraper-coating method of the present invention can stably fabricate large-area semiconductor elements with high-density nanoball distribution. In addition to the abovementioned nanoporous film and organic vertical transistor, the present invention is also applicable to other semiconductor processes.

The embodiments described above are only to exemplify the present invention but not to limit the scope of the present invention. Any equivalent modification or variation according to the spirit or characteristic of the present invention is to be also included within the scope of the present invention.

What is claimed is:

1. A nanoball solution coating method, which is used to deposit nanoballs of a nanoball solution on at least one substrate and attach said nanoballs to said substrate, comprising Step a: dripping said nanoball solution on said substrate, and using a scraper to coat said nanoball solution on said substrate to attach said nanoballs to said substrate;

Step b: flushing or flowing through said substrate with a heated volatile solution to suspend said nanoballs unattached to said substrate in said volatile solution; and Step c: using said scraper to scrape off said volatile solution carrying said nanoballs unattached to said substrate.

2. The nanoball solution coating method according to claim 1, wherein a gap between said scraper and said substrate is within 2-300 μm, and wherein said scraper has a circular, rectangular, polygonal or blade shape.

3. The nanoball solution coating method according to claim 1, wherein said volatile solution is miscible with said nanoball solution.

4. The nanoball solution coating method according to claim 3, wherein said volatile solution miscible with said nanoball solution is water or an alcohol that is liquid at an ambient temperature.

5. The nanoball solution coating method according to claim 1, wherein said Step b and said Step c are repeatedly undertaken to coat said nanoballs more uniformly on said substrate.

6. The nanoball solution coating method according to claim 1, further comprising Step d: drying said volatile solution on said substrate.

7. The nanoball solution coating method according to claim 5, further comprising Step d: drying said volatile solution on said substrate.

8. The nanoball solution coating method according to claim 6, wherein said substrate is dried via blowing said substrate with cool air or heating said substrate.

9. A method for fabricating a nanoporous film, comprising

Step a: providing a substrate, and dripping a row of a nanoball solution on said substrate;

Step b: using a scraper to coat said nanoball solution on said substrate to attach a plurality of nanoballs on said substrate;

Step c: forming a film covering said substrate and said nanoballs; and

Step d: removing said nanoballs covered by said film to form a nanoporous film.

10. The method for fabricating the nanoporous film according to claim 9, wherein before said Step c are undertaken two steps:

flushing or flowing through said substrate with a heated volatile solution to suspend said nanoballs unattached to said substrate in said volatile solution; and using said scraper to scrape off said volatile solution carrying said nanoballs unattached to said substrate.

11. The method for fabricating the nanoporous film according to claim 9, wherein said Step d further comprising steps:

sticking an adhesive material to said film; and peeling off said adhesive material to physically remove said nanoballs covered by said film and form said nanoporous film.

12. The method for fabricating the nanoporous film according to claim 9, wherein said Step d further comprising a step: using a solvent to dissolve said nanoballs, and removing said nanoballs and said film covering said nanoballs to form said nanoporous film.

13. The method for fabricating the nanoporous film according to claim 10, wherein said volatile solution is an isopropanol solution.

14. The method for fabricating the nanoporous film according to claim 9, wherein before said Step b is undertaken a step:

coating a P3HT (poly-3-hexyl thiophene) layer on said substrate to increase attachability of said nanoballs to said substrate.

15. A method for fabricating an organic vertical transistor, comprising

Step f: providing a substrate having a transparent conductive layer on a surface thereof;

Step g: forming an emitter layer or a collector layer on said transparent conductive layer;

Step h: coating an insulting layer on said emitter layer or said collector layer;

Step i: using a scraper to coat a nanoball solution on said insulating layer to attach a plurality of nanoballs to said insulating layer;

Step j: forming a base layer covering said substrate and said nanoballs;

Step k: sticking an adhesive material to said base layer;

Step l: peeling off said adhesive material to physically remove said nanoballs covered by said base layer and form a perforated base layer;

Step m: using said perforated base layer as a mask to etch said insulating layer to form a plurality of holes revealing said emitter layer or said collector layer;

Step n: forming an active layer covering said holes, and said emitter layer or said collector layer; and Step o: forming a collector layer or an emitter layer on said active layer.

16. The method for fabricating the organic vertical transistor according to claim 15, wherein before said Step j are undertaken Step p: flushing or flowing through said substrate with a heated isopropanol solution to suspend said nanoballs unattached to said substrate in said isopropanol solution;

Step q: using said scraper to scrape off said isopropanol solution carrying said nanoballs unattached to said substrate; and Step r: drying said isopropanol solution.

17. The method for fabricating the organic vertical transistor according to claim 15, wherein said Steps i-q are undertaken repeatedly to rearrange said nanoballs.

18. The method for fabricating the organic vertical transistor according to claim 15, wherein before said Step i is undertaken a step: coating a P3HT (poly-3-hexyl thiophene) layer on said insulating layer to increase attachability of said nanoballs to said insulating layer.

19. The method for fabricating the organic vertical transistor according to claim 15, wherein said active layer is made of P3HT and annealed.

20. The method for fabricating the organic vertical transistor according to claim 15, wherein said insulating layer is made of PVP (polyvinyl pyrrolidone) and annealed.

* * * * *